(12) United States Patent
Kakkad

(10) Patent No.: US 6,534,421 B2
(45) Date of Patent: Mar. 18, 2003

(54) METHOD TO FABRICATE THIN INSULATING FILM

(75) Inventor: Ramesh H. Kakkad, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/914,296

(22) PCT Filed: Dec. 27, 2000

(86) PCT No.: PCT/JP00/09364
§ 371 (c)(1),
(2), (4) Date: Aug. 27, 2001

(87) PCT Pub. No.: WO01/48076
PCT Pub. Date: Jul. 5, 2001

(65) Prior Publication Data
US 2002/0160623 A1 Oct. 31, 2002

(30) Foreign Application Priority Data
Dec. 27, 1999 (JP) .............................. 11-371208

(51) Int. Cl.[7] ................... H01L 21/31; H01L 21/469
(52) U.S. Cl. ................... 438/771; 438/772; 438/776; 438/777; 438/796
(58) Field of Search ............................ 438/591, 588, 438/788, 771, 798, 792, 772, 777, 776; 427/569, 249, 233; 257/410, 411

(56) References Cited

U.S. PATENT DOCUMENTS

| 4,555,303 A | | 11/1985 | Legge et al. .................. 156/643 |
| 5,180,690 A | * | 1/1993 | Czubatyj et al. ............. 136/258 |
| 5,304,407 A | * | 4/1994 | Hayashi et al. ........... 427/255.5 |
| 5,889,573 A | * | 3/1999 | Yamamoto et al. ........... 257/59 |
| 5,938,854 A | | 8/1999 | Roth .............................. 134/1 |
| 6,149,779 A | * | 11/2000 | Van Cleemput ....... 204/192.37 |
| 6,299,948 B1 | * | 10/2001 | Gherardi et al. ............... 216/71 |
| 2002/0014666 A1 | * | 2/2002 | Ohmi et al. .................. 257/368 |
| 2002/0111000 A1 | * | 8/2002 | Kawakami et al. .......... 438/584 |

FOREIGN PATENT DOCUMENTS

| JP | A-58-125833 | 7/1983 |
| JP | A-6-289401 | 10/1994 |

OTHER PUBLICATIONS

Wolf, S. and Tauber, R.N., Silicon Processing for the VLSI Era vol. 1–Process Technology–1986, Lattice Press, vol. 1, p. 168, 171, 184, 221–223.*

Roppel, T.; Reinhard, D.K.; Asmussen, J, "Low Temperature oxidation of silicon using a microwave plasma disk source"; Jan.–Feb.1986; Journal of Vacuum Science & Technology B; vol. 4, No. 1 See abstract of pp. 295–298.*

Ueno, Tomo et al., "Low–Temperature and Low–Activation–Energy Process for the Gate Oxidation of Si Substrates", *Jpn. J. Appl. Phys.*, vol. 39 (2000) Pt. 2, No. 4B, pp. L327–L329.

(List continued on next page.)

Primary Examiner—Carl Whitehead, Jr.
Assistant Examiner—Timothy Sutton
(74) Attorney, Agent, or Firm—Oliff & Berridge, PLC

(57) ABSTRACT

The invention grows $SiO_2$ films over silicon at temperatures as low as room temperature and at pressures as high as 1 atmosphere. The lower temperature oxidation is made possible by creation of oxygen atoms and radicals by adding noble gas(es) along with oxidizing gas(es) and applying RF power to create plasma. The invention also fabricates silicon nitride films by flowing nitrogen containing gas(es) with noble gas(es) and applying RF power to create plasma at pressures as high as one atmosphere. In addition, the above processes can also be performed using microwave power instead of RF power to create plasma.

27 Claims, 3 Drawing Sheets

OTHER PUBLICATIONS

Ohmi, Tadahiro et al., "Novel TFT Manufacturing with Microwave Excited High–density and Low Electron Temperature Plasma", *IDW* (1999), pp. 159–162.

Hirayama et al., "Low–Temperature Growth of High–Integrity Silicon Oxide Films by Oxygen Radical Generated in High–Density Krypton Plasma", International Electron Devices Meeting 1999. Technical Digest (CAT. No. 99CH36318), Washington, DC, USA, Dec. 5–8, 1999, pp. 249–252, XP002165119 1999.

Elajably et al., "Growth Kinetics and Annealing Studies of the "Cathodic" Plasma Oxidation of Silicon", Journal of the Electrochemical Society, Manchester, New Hampshire, vol. 138, No. 4, Apr. 1, 1991, pp. 1064–1070, XP000202511.

Cook et al., "Characterization of a radio–frequency discharge used for downstream plasma oxidation of Si", Journal of Applied Physics, US, American Institute of Physics, New York, vol. 77, No. 4, Feb. 15, 1995, pp. 1690–1695, XP000503485.

\* cited by examiner

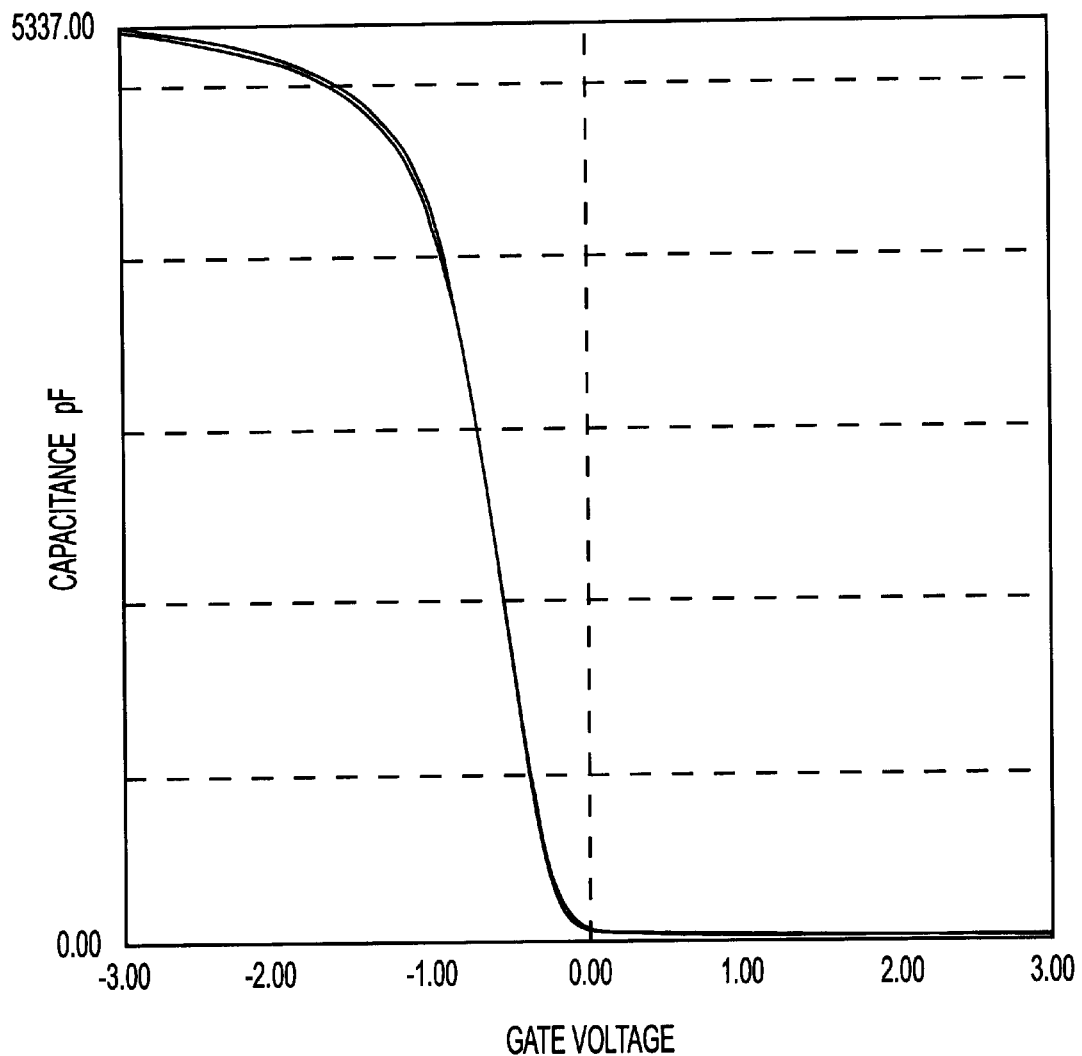

METHOD TO FABRICATE THIN INSULATING FILM

BACKGROUND OF THE INVENTION

1. Field of Invention

The present invention relates to a method of fabricating insulating films for application with thin film transistors (TFTs) and metal insulator oxide (MOS) transistors.

2. Description of Related Art

Forming an insulating film, such as $SiO_2$, is a significant step in the manufacture of transistors, such as silicon MOS-FET (Metal Oxide Semiconductor Field Effect Transistor). Formation of $SiO_2$ film on silicon is performed at temperatures that are usually higher than 1000° C. and in the presence of chemical species that oxidize the silicon. This process is known as thermal oxidation. The thermal oxidation process has undesirable side-effects, such as redistribution of the dopant profiles in the semiconductors, since significant diffusion of dopants occurs at the high temperatures that are used in this process.

Thin film transistor (TFT) devices, which have a basic structure that is similar to that of a typical MOSFET, have been used for display applications, such as liquid crystal displays (LCD) and organic electroluminescence displays (OELD). Such devices require an $SiO_2$ layer to be formed at a temperature that is below 430° C., since these displays use an optically transparent substrate, such as glass, which cannot withstand higher temperatures. For such TFT applications, currently deposited $Sio_2$ films are used which are of inferior quality, and which also form an inferior interface with silicon compared to $SiO_2$ that is produced by oxidation of silicon; thereby adversely affecting the TFT performance. Thus, it is required that the oxidation process be performed at temperatures that are as low as possible.

Recently, T. Ueno et al. JJAP 39, pp. L327 (2000) (reference 1) and T. Ohmi et al. Pro. of IDW (1999), pp. 159 (reference 2) reported that applying microwave field to a gas mixture of noble gas and oxygen generates plasma containing atomic oxygen and oxygen radicals, which easily oxidize silicon to form an $SiO_2$ film even at temperatures that are lower than 500° C.

The low temperature processes mentioned in the above references involve generation of plasma. Generally, plasma processes are performed at pressures of 1 torr (133 Pa) or less. Additionally, the process-chamber needs to be evacuated to an even lower pressure (base pressure) before the process gases are introduced into the chamber. Thus, these plasma processes require the use of expensive vacuum tools. The maintenance of the vacuum tools further adds to the cost. Vacuum tools also occupy expensive clean room space. Additionally, the microwave plasma processes used above are also limited in their applications. The microwave processes are suitable for semiconductor processing where the maximum size for the substrate is 300 mm in diameter. For the case of TFTs, the substrate size is much larger and approaches 1000 mm×1000 mm in the latest generation equipment. For such large substrate, the microwave plasma process is not suitable.

SUMMARY OF THE INVENTION

An object of the present invention is to provide an inexpensive method for fabricating high quality insulating films at low temperatures. Further, it is an object of this invention that such insulating films be fabricated over large substrate, such as those used in TFT fabrication.

In accordance with the invention, high quality $SiO_2$ films are fabricated by plasma excitation of noble gases along with oxygen at the pressures substantially close to atmospheric-pressure (about 100 kPa). This process completely eliminates the need of using vacuum tools, making the equipment and the process very inexpensive compared to equipment and processes used for making similar insulating films in TFT and semiconductor industries. Additionally, radio frequency (RF) power in the MHz range can be used in this process, which makes it possible to apply the process to large substrate.

Additionally, the same process can be used to form silicon nitride by using the nitriding species (such as $NH_3$, $N_2$, etc.) along with noble gases, and creating plasma at pressures that are substantially close to atmospheric pressure.

The method of creating RF plasma at pressures that are substantially close to atmospheric-pressure is advantageous from cost and simplicity perspectives. As a matter of course, even if the process pressure is reduced to be as low as 1 kPa, the processes can be performed with inexpensive vacuum tools.

BRIEF DESCRIPTION OF THE DRAWINGS

FIG. 3 is a C-V curve for the MOS capacitor fabricated using the $SiO_2$ film that is grown using the disclosed method of example 2 in accordance with the invention.

DETAILED DESCRIPTION OF PREFERRED EMBODIMENTS

Figure 1:
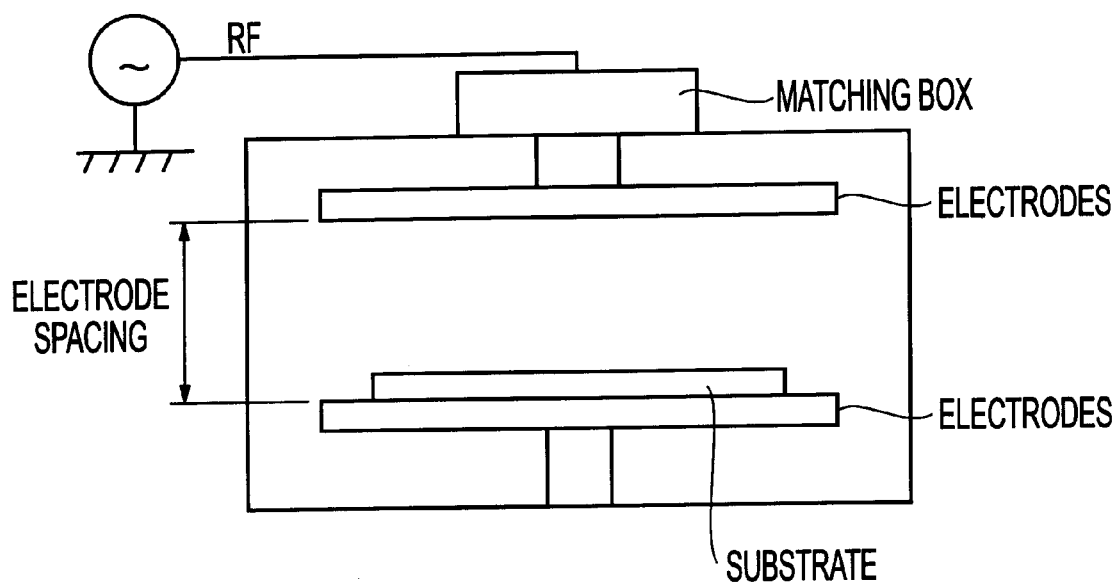
FIG. 1 is a schematic of a plasma oxidation process using RF power in accordance with the invention.

In accordance with the invention, a noble gas and a reagent gas (such as an oxidizing agent) were introduced into a chamber. The chamber contains two electrodes (see FIG. 1) between which RF power was applied. The pressure in the chamber was substantially close to one atmosphere (about 100 kPa), and no vacuum equipment was employed in this process. In the routine plasma processing currently being employed in the industry, which is done at pressures in the order of 100 Pa or lower, the formation of plasma is relatively easy. In these routine plasma processes, typically the RF power density is in the order of several hundred milli-watts/cm$^2$, and the spacing between the electrodes is in the order of 20 mm. However, it becomes increasingly difficult to form plasma as the pressure is increased. It has also been almost impossible to create plasma at pressures that are substantially close to one atmospheric using only the reagent gases, such as oxygen. Adding a noble gas, such as helium or argon, in large proportion to the reagent gas, makes it easier to form plasma at higher pressures. However, forming plasma at pressures that are as high as atmospheric pressure is still quite difficult. In order to create plasma at the pressures that are substantially close to one atmospheric pressure, RF power density and the electrode spacing had to be changed significantly, and a noble gas had to be added to a reagent gas. The inventor found that the RF power density of several watts/cm$^2$ in the MHz range was necessary. A plasma was more effectively formed when the distance between the electrodes, on which RF power was applied, was less than 5 mm.

In addition to oxidation of silicon, the above process can also be applied to nitridation of silicon at pressures that are substantially close to one atmosphere. The nitridation can be carried out by in the presence of nitrogen containing-compounds (such as $N_2$, $NH_3$ etc.) instead of oxygen containing compounds along with noble gas(s) and sustaining plasma. These nitride films can be subjected to further processing, such as annealing (thermal annealing, rapid thermal annealing, laser annealing), to further enhance the quality of the films.

It should also be noted that these processes were performed at the pressure of 1 atmosphere (close to 100 kPa). If needed, it is possible to reduce pressure down to 1 kPa with inexpensive vacuum tools. Thus, the above processes can be performed in a gas pressure range of 1 kPa to 110 kPa.

Instead of RF, microwaves can be used to create plasma at relatively higher gas pressures (for example, 1 kPa or higher), although microwaves have been used to create plasma at pressures that are lower than 1 kPa.

EXAMPLE 1

Figure 2:
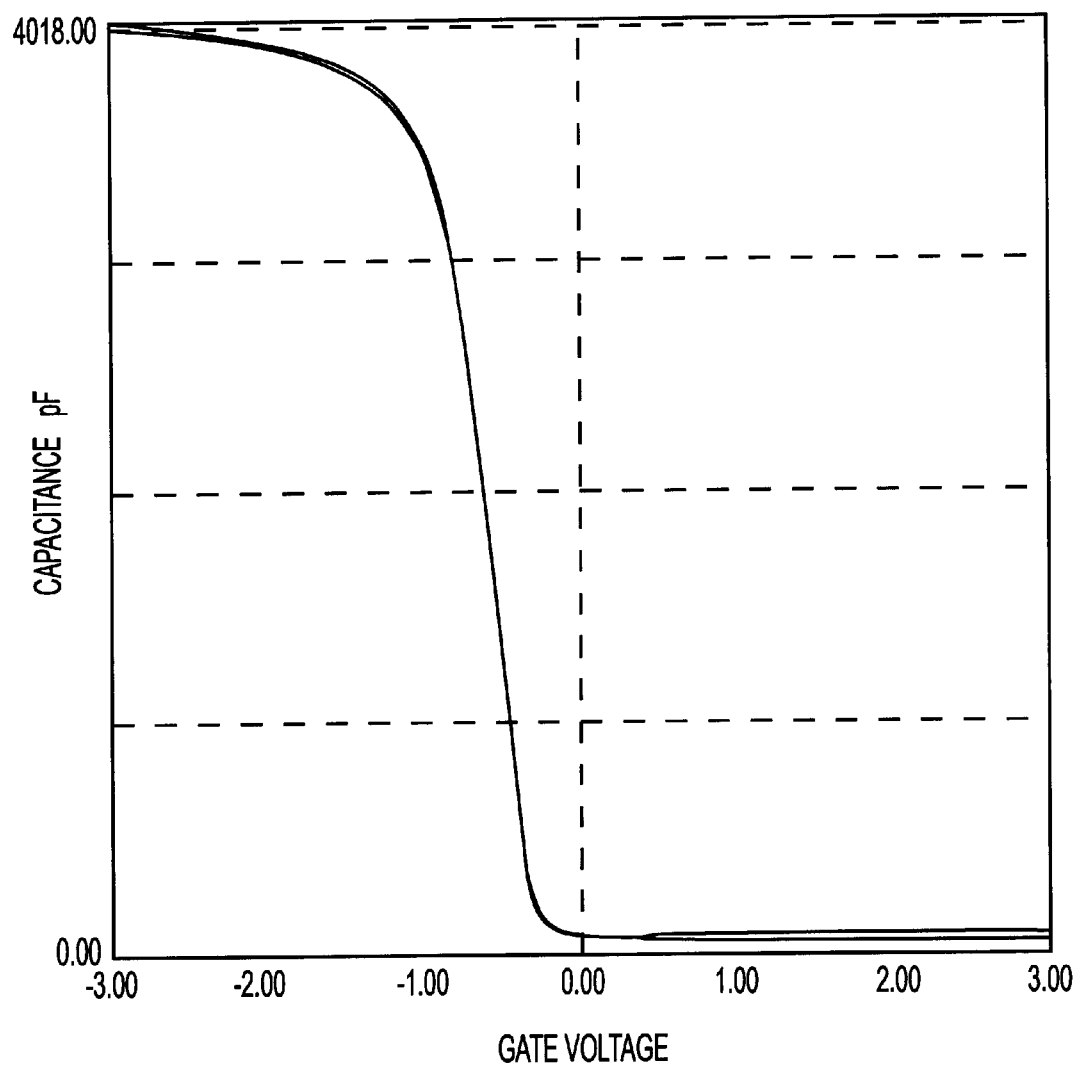
FIG. 2 is a C-V curve for the MOS capacitor fabricated using the $SiO_2$ film that is grown using the disclosed method of example 1 in accordance with the invention.

According to the above process guidelines, the oxidation of silicon was performed in the following manner. Helium gas and oxygen gases were introduced into a chamber in which silicon substrate to be oxidized was placed. The percent of oxygen in the gas mixture was 2%. The pressure was one atmosphere (about 100 kPa). The plasma was sustained by RF power at a frequency of 40 MHz. The RF power density was 3W/cm$^2$. The temperature was 200° C. The electrode spacing was 1.5 mm. The silicon substrate, 0.5 mm thick, was placed on the lower electrode. FIG. 2 shows a high frequency C-V curve of a metal oxide semiconductor (MOS) capacitor fabricated after growing the Sio$_2$ films on p-type silicon using the above conditions. The C-V curve is close to the ideal case and has no hysteresis. The defect state density at the Si—SiO$_2$ interface (interface state density or $D_{it}$) near the silicon mid-gap energy was determined using low-frequency C-V characterization. The $D_{it}$ value was found to be close to $5\times10^{10}$ cm$^{-2}$-eV$^{-1}$. Such a low value of $D_{it}$ indicates an excellent, device-quality interface.

In order to determine how this $D_{it}$ value compares with SiO$_2$ films formed in a similar way using routine low-pressure plasma, oxidation experiments were performed at 133 Pa (1 torr) pressure. The other experimental conditions were as follows. RF power density=500 milli-watts/cm$^2$, electrode spacing=20 mm, temperature=200 degree C., and O$_2$/He=2%. The $D_{it}$ value obtained for the Si—SiO$_2$ interface for this low-pressure plasma oxidation process was $6\times10^{11}$ cm$^{-2}$eV$^{-1}$. Thus, the defect density at the Si—SiO$_2$ interface for the SiO$_2$ films fabricated using the plasma process at pressures that are substantially close to 1 atmosphere is much lower than that for the SiO$_2$ fabricated at the lower plasma pressure of 133 Pa.

For comparing the interface state density of the Si—SiO$_2$ interface fabricated by the disclosed method to that of a thermally grown SiO$_2$ film, similar silicon wafers were oxidized at 1000° C. The density interface state in the thermal oxidation case was found close to $2\times10^{11}$ cm$^{-2}$eV$^{-1}$. Thus, the defect density at the Si—SiO$_2$ interface for the SiO$_2$ films fabricated at 200° C. using the plasma process at pressure substantially close to 1 atmosphere is also lower than that for the SiO$_2$ fabricated at 1000° C. using thermal oxidation, indicating high quality of interface obtained using the disclosed process.

EXAMPLE 2

In the disclosed process of example 1, the silicon substrate, that is to react with plasma, was placed between the electrodes, between which the plasma was created. It is possible to create plasma by applying RF power in a separate chamber, and then transferring the plasma to another chamber in which a silicon substrate, that is to react with the plasma, is placed. Such a process is referred to as a remote plasma process, and is expected to reduce plasma damage to the substrate, and to further enhance the quality of the SiO$_2$ films. MOS capacitors were fabricated using the SiO$_2$ films produced by remote plasma oxidation. For the SiO$_2$ formation, the pressure was 1 atmosphere (about 100 kPa), the temperature was 200° C., the O$_2$/He gas flow ratio was 1.5%, and the power density was 70 W/cm$^2$. FIG. 3 shows the C-V characteristics of the MOS capacitor. In spite of using very high power density, no hysteresis is shown in FIG. 3, showing low damage to SiO$_2$ films by remote plasma process.

In the above two examples, oxygen is used as an oxidizing agent. However other oxidizing agents, such as $N_2O$ or $H_2O$ or a mixture of various oxidizing agents, can also be used along with the noble gas to perform the oxidation process.

These SiO$_2$ films can be subjected to annealing, such as thermal annealing or laser annealing, to further enhance their properties, preferably in an ambient that contains hydrogen, such as forming gas ambient.

It was also observed that adding a small amount of fluorine-containing compound (such as HF, NF$_3$, CF$_4$) to the process gas mixture enhanced the oxidation rate compared to that observed without the addition of fluorine containing compound. Adding chlorine-containing compound also exhibited similar enhancement of the oxidation rate. The addition of fluorine or chlorine compound also enhanced the film quality.

The disclosed process can be further refined by adding nitrogen or nitrogen containing compound along with oxidizing agent(s) and noble gas(es) to enhance the reliability of a device incorporating the silicon dioxide films.

EXAMPLE 3

The SiO$_2$ film produced by the disclosed process was incorporated in the fabrication process of TFTs. Two kinds of TFTs were fabricated, i.e., 1) Reference TFTs, which were fabricated by a routine TFT process, and 2) Plasma oxidation TFTs, which were fabricated by the following steps, of which step 3 includes one of the methods related to the present invention.

1. On a glass substrate, an amorphous silicon layer, with a thickness of 50 nm, was deposited by an LPCVD method.

2. The amorphous silicon films were laser annealed by a XeCl pulsed laser to change it into polycrystalline silicon with an approximate grain size of 0.3 micrometers, and the polycrystalline silicon layer was subsequently patterned by photolithography to make islands.

3. An SiO$_2$ layer (SiO$_2$ layer 1) with a thickness of 4 nm was fabricated over the polycrystalline silicon applying RF power to oxygen-helium gas mixture at a pressure that was substantially close to 1 atmosphere (about 100 kPa). An SiO$_2$ layer (SiO$_2$ layer 2) was further deposited by ECR CVD method so that the total thickness of a layer including SiO$_2$ layer 1 and SiO$_2$ layer 2 was 120 nm.

4. Gate metal was deposited and patterned.

5. Source and drain regions were created by ion doping.

6. An isolation SiO$_2$ layer was deposited and patterned to form source-drain contact holes.

7. Source-drain contact metal was deposited and patterned.

The reference TFTs for purposes of comparison were fabricated by an identical process mentioned above except for fabricating SiO$_2$ layer in step 3. The reference TFTs did not contain the said SiO$_2$ layer 1. Instead, the entire SiO$_2$ layer was deposited by ECR CVD having a thickness of 120 nm. Thus, the reference TFT process is similar to a routine TFT process, whereas the plasma oxidation TFT process includes an additional SiO$_2$ layer (SiO$_2$ layer 1) in order to enhance the interface between polycrystalline silicon and the SiO$_2$ layer.

When the performance of the two kinds of TFTs was evaluated and compared, the plasma oxidation TFTs performed better than the reference TFTs in all respects. An n-channel mobility value of 170 cm$^2$V$^{-1}$sec$^{-1}$ for the plasma-oxidation TFTs was obtained, compared to a value of 120 cm$^2$V$^{-1}$sec$^{-1}$ for the reference TFTs. A sub-threshold-slope value of 0.4 V/decade for the plasma-oxidation TFTs was obtained, compared to a value of 0.64 V/decade for the reference TFTs. An order of magnitude lower off-current value for plasma oxide TFTs was obtained, compared to the reference TFTs. All of these results indicate a significantly better performance of the plasma oxidation TFTs.

What is claimed is:

1. A method for fabricating SiO$_2$ film, comprising:

providing a silicon-containing substrate in a chamber;

introducing one or more gases, which contain at least one oxidizing gas, into the chamber, a pressure in the chamber being controlled in a range of from 1 kPa to 110 kPa;

applying RF power in a MHz range, the RF power being applied under such a condition that:

a plasma containing at least reactive oxidizing species is generated, and the reactive oxidizing species reacts with the silicon of the substrate to convert at least a part of the silicon into SiO$_2$.

2. The method of claim 1, the applying step including applying RF power having a frequency in a range of 1 MHz to 100 MHz.

3. The method of claim 1, the applying step including applying RF power between electrodes that are spaced apart by 5 mm or less.

4. The method of claim 1, wherein the one or more gases further include one or more noble gases of helium, argon, neon, krypton, xenon or any one of a mixture of at least two chosen from the group consisting of helium, argon, neon, krypton and xenon.

5. The method of claim 1, wherein the at least one oxidizing gas is oxygen, Ozone, H$_2$O, N$_2$O, or any one of a mixture of at least two chosen from the group consisting of oxygen, Ozone, H$_2$O and N$_2$O.

6. The method of claim 1, the applying step includes applying RF power at a pressure such that the ratio of partial pressure of said at least one oxidizing gas to the total gas pressure ranges from 0.05 to 15 percent.

7. The method of claim 1, further including the step of placing said silicon to be oxidized between electrodes to which RF power is applied to create plasma.

8. The method of claim 1, the applying step including applying RF power such that an RF power density is in a range of 0.5 to 10 W/cm2.

9. The method of claim 1, further including the steps of preventing said silicon to be oxidized from being placed between electrodes between which the plasma is created; and subsequently transporting the plasma created between the electrodes by application of RF power to the silicon.

10. The method of claim 9, the applying step including RF power such that an RF power density is in a range of 1 to 100 W/cm2.

11. The method of claim 1, wherein a temperature of the silicon during the reaction with the reactive oxidizing species is in a range of 20° C. to 700° C.

12. The method of claim 1, wherein a temperature of the silicon-containing substrate during the reaction with the reactive oxidizing species is in a range of 20° C. to 430° C.

13. The method of claim 1, further including the step of annealing that includes at least one of thermal annealing, rapid thermal annealing, and laser annealing of the SiO$_2$ film.

14. The method of claim 13, the annealing step including annealing in an ambient containing hydrogen.

15. The method of claim 1, the applying and reacting steps being performed in the presence of fluorine-containing compound, the partial pressure of the fluorine-containing gas being less than 1 percent of the total gas pressure.

16. The method of claim 1, the applying and reacting steps being performed in the presence of chlorine-containing compound, the partial pressure of the chlorine-containing gas being less than 5 percent of the total gas pressure.

17. The method of claim 1, the applying step including applying RF power in the presence of nitrogen or nitrogen containing compound in addition to the at least one oxidizing gas.

18. A method of fabricating silicon nitride film, comprising:

providing a silicon-containing substrate in a chamber;

introducing one or more gases, which contain at least one nitriding gas, into the chamber, a pressure in the chamber being controlled in a range of from 1 kPa to 110 kPa;

applying RF power in a MHz range, the RF power being applied under such a condition that:

a plasma containing at least reactive nitriding species is generated, and the reactive nitriding species reacts with the silicon of the substrate to convert at least a part of the silicon into silicon nitride.

19. The method of claim 18, wherein the one or more gases further include one or more noble gases of helium, argon, neon, krypton, xenon, or any one of a mixture of at least two chosen from the group consisting of helium, argon, neon, krypton and xenon.

20. The method of claim 18, wherein the at least one nitriding gas is nitrogen, NH$_3$, N$_2$O, or any one of a mixture of at least two chosen from the group consisting of nitrogen, NH$_3$ and N$_2$O.

21. The method of claim 18, further including placing said silicon between electrodes to which RF power is applied to create plasma.

22. The method of claim 18, further including the steps of preventing said silicon from being placed between electrodes between which the plasma is created, and subsequently transporting the plasma created between the electrodes by application of RF power to the silicon.

23. The method of claim 18, further including annealing that includes at least one of thermal annealing, rapid thermal annealing, and laser annealing of the silicon nitride film.

24. The method of claim 23, the annealing step including annealing in an ambient containing hydrogen.

25. A method of fabricating $SiO_2$ film, comprising:

applying RF power in the presence of noble gas(es) and oxidizing gas(es) at a total pressure in a range of 1 kPa to 110 kPa to create a plasma containing reactive oxidizing species; and subsequently reacting the reactive oxidizing species with a silicon part of a substrate to convert at least a part of silicon into $SiO_2$.

26. A method of fabricating silicon nitride film, comprising:

applying RF power in the presence of noble gas(es) and nitriding gas(es) at a total pressure in a range of 1 kPa to 110 kPa to create a plasma containing reactive nitriding species; and subsequently reacting the reactive nitriding species with a silicon part of a substrate to convert at least a part of silicon into silicon nitride.

27. A method of fabricating an insulator film, comprising:

applying microwave power in the presence of noble gas(es) and reagent gas(es) at a total pressure in a range of 1 kPa to 110 kPa to create a plasma containing reactive reagent species; and subsequently reacting the reactive species with a silicon part of a substrate to convert at least a part of silicon into an insulator film.

* * * * *